(12) United States Patent
Naito et al.

(10) Patent No.: US 6,215,647 B1
(45) Date of Patent: Apr. 10, 2001

(54) MULTILAYER CAPACITOR

(75) Inventors: Yasuyuki Naito, Takefu; Masaaki Taniguchi, Fukui-ken; Yoichi Kuroda, Fukui; Takanori Kondo, Sabae, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/458,154

(22) Filed: Dec. 9, 1999

Related U.S. Application Data

(63) Continuation of application No. 09/042,379, filed on Mar. 13, 1998, now Pat. No. 6,072,687.

(30) Foreign Application Priority Data

Nov. 10, 1997 (JP) .................................................. 9-306717

(51) Int. Cl.[7] ........................... H01G 4/005; H01G 4/228
(52) U.S. Cl. .................... 361/303; 361/306.1; 361/308.1
(58) Field of Search ................................ 361/303, 306.1, 361/306.2, 306.3, 308.1, 309, 310–313, 321.1–321.5, 320

(56) References Cited

U.S. PATENT DOCUMENTS

| | | |
|---|---|---|
| 3,308,359 | 3/1967 | Hayworth et al. . |
| 3,612,963 | 10/1971 | Piper et al. . |
| 3,822,397 | 7/1974 | Puppolo et al. . |
| 3,971,970 | 7/1976 | Voyles et al. . |
| 4,074,340 | 2/1978 | Leigh . |
| 4,274,124 | 6/1981 | Feinberg et al. . |
| 4,295,183 | 10/1981 | Miersch et al. . |
| 4,328,530 | 5/1982 | Bajorek et al. . |
| 4,346,429 | 8/1982 | DeMatos . |
| 4,419,714 | 12/1983 | Locke . |
| 4,424,552 | 1/1984 | Saint Marcoux . |

(List continued on next page.)

FOREIGN PATENT DOCUMENTS

| | | |
|---|---|---|
| 0 191 668 | 8/1986 | (EP) . |
| 2 707 123 | 1/1995 | (FR) . |
| 6-260364 | 9/1994 | (JP) . |

OTHER PUBLICATIONS

Translation of French Patent No. 2 707 123 Jan. 1995.
1991 Symposium on VLSI Technology, Digest of Technical Papers entitled Multilayer Vertical Stacked Capacitors (MVDTC) for 64 Mbit and 256 Mbit DRAMS by D. Temmler, Institute of Semiconductor Physics, Germany.
IBM Technical Disclosure Bulletin (vol. 31 No. 3 Aug. 1988).
IBM Technical Disclosure Bulletin (vol. 32 No. 6B Nov. 1989).

Primary Examiner—Anthony Dinkins
(74) Attorney, Agent, or Firm—Keating & Bennett, LLP

(57) ABSTRACT

A multilayer capacitor whose equivalent series inductance is reduced includes a capacitor main body having a generally rectangular parallelpiped shape with two principal surfaces in a face-to-face relationship with each other and four side surfaces connecting the principal surfaces. A capacitor unit is formed in the capacitor main body by a respective pair of first and second internal electrodes disposed in the main body in a face-to-face relationship with a dielectric material layer interposed therebetween. At least three first external electrodes are located on respective ones of the side surfaces of the capacitor main body, with at least one of the first external electrodes being located on each of at least three of the side surfaces. The first internal electrode has at least three first lead electrodes, each of which extends to and is electrically coupled to a respective one of the first external electrodes. A plurality of second external electrodes are located on respective side surfaces of the capacitor main body and the second internal electrode has an equal plurality of second lead electrodes, each extending to and being electrically coupled to a respective one of the second external electrodes.

38 Claims, 10 Drawing Sheets

U.S. PATENT DOCUMENTS

| | | |
|---|---|---|
| 4,430,690 | 2/1984 | Chance et al. . |
| 4,706,162 | 11/1987 | Hernandez et al. . |
| 4,814,940 | 3/1989 | Horstmann et al. . |
| 4,830,723 | 5/1989 | Galvagni et al. . |
| 4,831,494 | 5/1989 | Arnold et al. . |
| 4,852,227 | 8/1989 | Burks . |
| 4,853,826 | 8/1989 | Hernandez . |
| 4,862,318 | 8/1989 | Galvagni et al. . |
| 5,517,385 | 5/1996 | Galvagni et al. . |
| 5,880,925 | 3/1999 | DuPre et al. . |

MULTILAYER CAPACITOR

This is a continuation application of U.S. patent application Ser. No. 09/042,379, filed on Mar. 13, 1998 now U.S. Pat. No. 6,072,687.

BACKGROUND OF THE INVENTION

1. Field of the Invention

The present invention relates to a multilayer capacitor and, more particularly, to a multilayer capacitor which can be advantageously used in high frequency circuits.

2. Description of the Related Art

Conventional multilayer capacitors include that described in Japanese Unexamined Patent Publication No. H2-256216 in which a multilayer capacitor 1, as shown in FIGS. 15 through 17, is disclosed. FIG. 15 is a plan view of the external appearance of the multilayer capacitor 1. FIG. 16 is a plan view of a first section of the multilayer capacitor 1 showing a first electrode 10 located on one surface of one internal dielectric layer 9 of the capacitor 1. FIG. 17 is a plan view of a second section of the multilayer capacitor 1 showing a second electrode 11 located on one surface of a differential internal dielectric layer 9 of the capacitor 1.

Referring to FIGS. 15–17, the multilayer capacitor 1 includes a capacitor main body 8 in the form of a rectangular parallelpiped having two principal surfaces 2 and 3 in a face-to-face relationship with each other and four side surfaces 4, 5, 6 and 7 connecting the principal surfaces 2 and 3. The capacitor main body 8 includes a plurality of dielectric layers 9 (FIGS. 16–17) made of, for example, a ceramic dielectric material. Each of the dielectrical layers is generally planar in shape and lies generally parallel to the principal surfaces 2 and 3. At least a pair of first and second internal electrodes 10 and 11 are provided on respective surfaces of the dielectric layers 9 in a face-to-face relationship with each other with a dielectric layer 9 interposed therebetween to form a capacitor unit.

The first internal electrode 10 is formed with four lead electrodes 12, 13, 14 and 15 which extend to two opposing side surfaces 4 and 6, as shown.

Each lead electrode 12, 13, 14 and 15 is coupled to a respective external terminal electrode 16, 17, 18 and 19 provided on the side surfaces 4 and 6 of the capacitor main body 8. Specifically, the lead electrodes 12 and 13 are connected to the external terminal electrodes 16 and 17, respectively, which are located on the side surface 4, and the lead electrodes 14 and 15 are connected to the external terminal electrodes 18 and 19, respectively, which are located on the side surface 6.

Referring to FIG. 17, the second internal electrode 11 is also formed with four lead electrodes 20, 21, 22 and 23 which extend to the side surfaces 4 and 6, respectively. More specifically, the lead electrodes 20 and 21 extend to positions on the side surface 4 which are different from the positions to which the lead electrodes 12 and 13 extend, and the lead electrodes 22 and 23 extend to positions on the side surface 6 of the main body 8 which are different from the positions to which the lead electrodes 14 and 15 extend.

The lead electrodes 20 through 23 are electrically coupled to external terminal electrodes 24, 25, 26 and 27, respectively. External terminal electrodes 24 and 25 are located on the side surface 4 at positions which are different from those of the external terminal electrodes 1G and 17. External terminal electrodes 26 and 27 are located on the side surface 6 at positions which are different from the positions of the external terminal electrodes 18 and 19.

Thus, the plurality of first external terminal electrodes 16 through 19 and the plurality of second external terminal electrodes 24 through 27 are arranged on the two side surfaces 4 and 6 such that they alternate adjacently to each other.

FIG. 18 illustrates current flowing through the multilayer capacitor 1 as viewed in plan view corresponding to FIG. 17. In FIG. 18, first internal electrode 10 and second internal electrode 11, shown with broken and solid lines, respectively, are shown in an overlapping relationship.

In FIG. 18, the arrows indicate typical current paths and directions. In the state illustrated, current flows from each of the external terminal electrodes 24 through 27 to each of the external terminal electrodes 16 through 19. Because an alternating current is used, the direction of current flow will reverse periodically.

When the currents flow, magnetic flux is induced. The direction of the flux is determined by the direction of the currents to produce self-inductance components. Since the currents flow in various directions at central regions 28 (indicated by circles) of the internal electrodes 10 and 11, the induced magnetic flux generated by the various currents is canceled and substantially no net magnetic flux is produced in those regions.

The current in the vicinity of each of the external terminal electrodes 16 through 19 and 24 through 27 tends to flow toward each of the external terminal electrodes 16 through 19 and away from each of the external terminal electrodes 24 through 27. There are currents that flow to the left and right as viewed in FIG. 18 to spread at an angle of about 180 degrees. As a result, a major part of magnetic flux is canceled and there is no significant generation of net magnetic flux in these areas.

Therefore, in the multilayer capacitor 1 shown in FIGS. 15 through 17, the generation of self-inductance is suppressed in the areas points described above to reduce equivalent series induction (hereinafter "ESL").

However, currents flow substantially in the same direction in the vicinity of each of the side surfaces 5 and 7 on which no external terminal electrodes are provided, i.e., at each of the left and right edge portions indicated by hatching in FIG. 18. This results in substantially no cancellation of magnetic flux in these areas and significant net self-inductance is created. Therefore, the measures taken to reduce ESL in the multilayer capacitor 1 shown in FIGS. 15 through 17 is less than desirable.

SUMMARY OF THE INVENTION

It is therefore an object of the invention to provide a multilayer capacitor which more effectively reduces ESL.

In accordance with one aspect of the present invention, a multilayer capacitor, comprises:

a capacitor main body having a generally rectangular parallelpiped shape with two principal surfaces in a face-to-face relationship with each other and four side surfaces connecting said principal surfaces;

m capacitor units formed in said capacitor main body, m being an integer greater than or equal to one, each of said capacitor units being formed by a respective pair of first and second internal electrodes disposed in said main body in a face-to-face relationship with a dielectric material layer interposed therebetween to form a capacitor unit;

n first external electrodes, n being an integer greater than 2; each of said first external electrodes being located on a respective one of said side surfaces of said capacitor main body, at least one of said first external electrodes being located on each of at least three of said side surfaces;

said first internal electrode having n first lead electrodes, each of said first lead electrodes extending to and being electrically coupled to a respective one of said first external electrodes;

p second external electrodes, p being an integer greater than 1, each of said second external electrodes being located on a respective one of said side surfaces of said capacitor main body; and said second internal electrode having p second lead electrodes, each of said second lead electrodes extending to and being electrically coupled to a respective one of said second external electrodes.

The internal and lead electrodes are preferably arranged in such a manner that when currents of different polarity are applied to said first and second internal electrodes, the net induced inductance in the area of all four of said side surfaces is substantially zero.

In one embodiment of the present invention, the first internal electrode is formed with at least four first lead electrodes which extend respectively to respective ones of the four side surfaces. An equal number of first external terminal electrodes are provided. At least one of the first external terminal electrodes is located on each of the four side surfaces.

In this embodiment, the second internal electrode is formed with at least four second lead electrodes which extend to respective ones of the four side surfaces. An equal number of second external terminal electrodes are provided. At least one of the second external terminal electrodes is located on each of the four side surfaces.

It is more advantageous it the above-described configuration is employed for both of the first and second internal electrodes.

In another embodiment, for each side surface which has both a first and a second external terminal electrode, each of the first external terminal electrodes located on that surface is located adjacent to one a corresponding second external terminal electrode located on that side surface. It is more advantageous if all of the first external terminal electrodes and all of the second external terminal electrodes are arranged such that they alternate with each other throughout the four side surfaces.

In yet another embodiment, all of the external terminal electrodes are arranged such that they are not adjacent to any other external electrode which is connected to the same internal electrode.

In still another embodiment, the first external internal electrode is formed with three first lead electrodes which extend respectively to three of the side surfaces. The second internal electrode is formed with two second lead electrodes which extend respectively to two of the side surfaces, one of which does have a first external electrode.

In the most preferred embodiment, at least one of the first and at least one of the second external terminal electrodes is provided on each of the four side surfaces.

A plurality of capacitor units can be provided in the multilayer capacitor. Each capacitor unit includes a respective pair of first and second internal electrodes with a respective dielectric layer located therebetween.

According to the present invention, the effect of reducing ESL can be expected from effective cancellation of magnetic and reduction of the lengths of currents achieved by providing a third internal electrode facing at least either the first or second internal electrodes with a dielectric material layer interposed therebetween. The third internal electrode is formed with at least two third lead electrodes which extend to respective ones of the side surfaces. An equal number of third external terminal electrodes are provided on the corresponding side surfaces and are electrically coupled to, respective ones of the third lead electrode.

In the above-described embodiment, when all of the first, second and third external terminal electrodes are arranged in the same order of arrangement repeated throughout the four side surfaces, the various components of magnetic flux can be more effectively canceled and the lengths of the current paths can be shortened further for a further reduction of ESL.

BRIEF DESCRIPTION OF THE DRAWINGS

For the purpose of illustrating the invention, there is shown in the drawing several forms which are presently preferred, it being understood, however, that the invention is not limited to the precise arrangements and instrumentalities shown.

DETAILED DESCRIPTION OF THE PREFERRED EMBODIMENTS

First Embodiment

Figure 1:
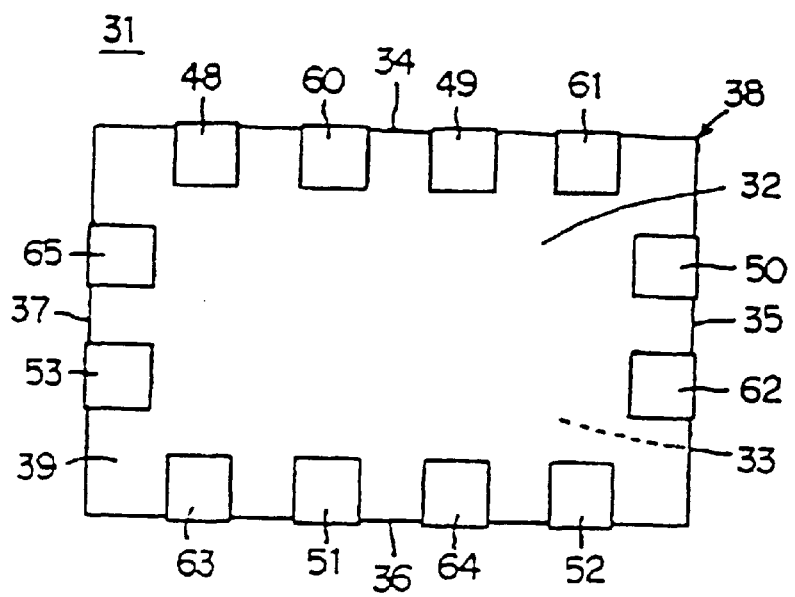
FIG. 1 is a plan view of a multilayer capacitor 31 according to a first embodiment of the present invention.
Figure 2:
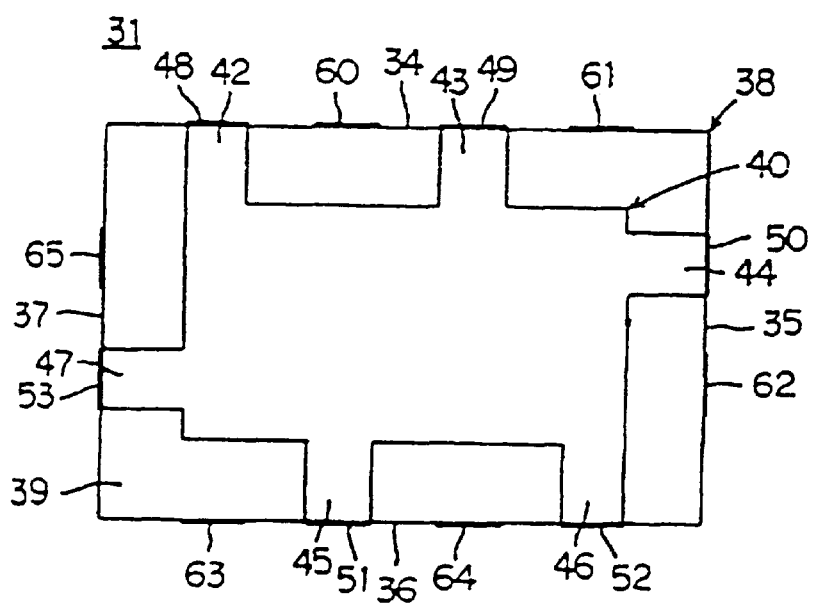
FIG. 2 is a plan view of the multilayer capacitor 31 shown in FIG. 1 showing an internal structure thereof in the form of a section along which a first internal electrode 40 extends.
Figure 3:
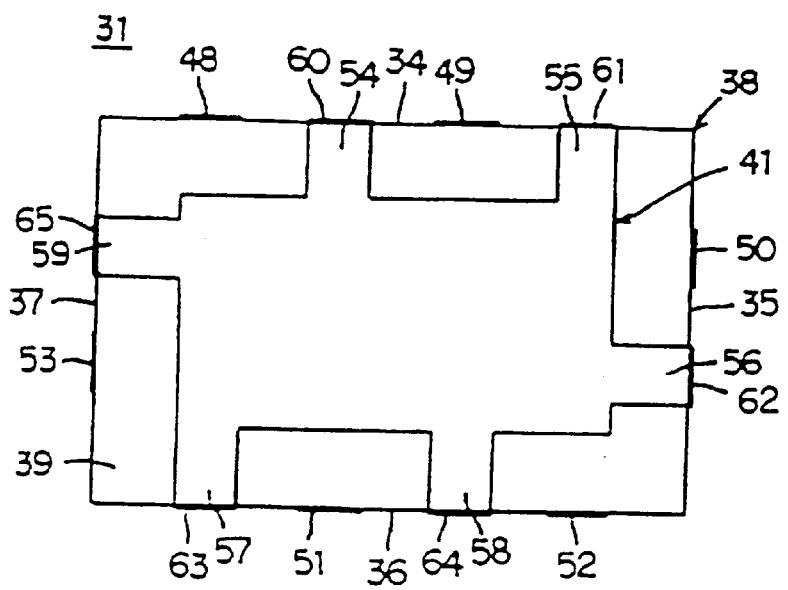
FIG. 3 is a plan view of the multilayer capacitor shown 31 in FIG. 1 showing an internal structure thereof in the form of a section along which a second internal electrode 41 extends.

Referring now to the drawings, wherein like numerals indicate like elements, there is shown in FIGS. 1 through 3 a first embodiment of a multilayer capacitor constructed in accordance with the principles of the present invention and designated generally as 31. FIGS. 1 through 3 correspond to FIGS. 15 through 17.

FIG. 1 is a plan view of the external appearance multilayer capacitor 31. FIG. 2 is a plan view multilayer capacitor 31 showing a first internal electrode 40 located on one surface of a first internal dielectric layer 39 of the capacitor 31. FIG. 3 is a plan view of a second section of the multilayer capacitor 31 showing a second internal electrode 41 located on one surface of a second internal dielectric layer 39 of the capacitor 31.

Multilayer capacitor 31 includes a capacitor main body 38 in the form of a rectangular parallelpiped having two opposed principal surfaces 32 and 33 and four side surfaces 34, 35, 36 and 37 extending therebetween. The capacitor main body 38 includes a plurality of generally planar dielectric layers 39 made of, for example, a ceramic dielectric material. The main surfaces of the dielectric layers .39 are situated generally parallel to the principal surfaces 32, 33 of the capacitor main body 38. At least a pair of first and second internal electrodes 40 and 41 are provided in a face-to-face relationship with each other with a dielectric material layer 39 interposed therebetween, each such pair of internal electrodes forming a respective capacitor unit.

As shown in FIG. 2, the first internal electrode 40 has six lead electrodes 42, 43, 44, 45, 46 and 47, each of which extends to a respective one of the four side surfaces 34 through 37. Particularly, the lead electrodes 42 and 43 extend to the side surface 34; the lead electrode 44 extends to the side surface 35; the lead electrodes 45 and 46 extend to the side surface 36; and the lead electrode 47 extends to the side surface 37.

Each lead electrode 42–47 is electrically coupled to a respective external terminal electrodes 48–53. The external terminal electrodes 48 and 49, connected to the lead electrodes 42 and 43, respectively, are located on the side surface 34; the external terminal electrode 50, connected to the lead electrode 44, is located on the side surface 35; the external terminal electrodes 51 and 52, connected to the lead electrodes 45 and 46, respectively, are located on the side surface 36; and the external terminal electrode 53, connected to the lead electrode 47, is located on the side surface 37.

As shown in FIG. 3, the internal electrode 41 is formed with six second lead electrodes 54, 55, 56, 57, 58 and 59, each of which extend to a respective one of the four side surfaces 34 through 37. More specifically, the lead electrodes 54 and 55 extend to side surface 34; lead electrode 56 extends to side surface 35; lead electrodes 57 and 58 extend to side surface 36; and lead electrode 59 extends to the side surface 37.

The positions on the side surfaces 34 through 37 to which the respective lead electrodes 54 through 59 extend are different from the positions to which the respective lead electrodes 42 through 47 extend.

External terminal electrodes 60, 61, 62, 63, 64 and 65, which are electrically coupled to respective lead electrodes 54 through 59, are provided on the side surfaces 34 through 37 a positions which are different than the positions of the external terminal electrodes 48 through 53. External terminal electrodes 60 and 61, connected to lead electrodes 54 and 55, respectively, are located on side surface 34; external terminal electrode 62, connected to lead electrode 56, is located on side surface 35; external terminal electrodes 63 and 64, connected to lead electrodes 57 and 58, respectively, are located on side surface 36; and external terminal electrode 65, connected to lead electrode 59, are located on side surface 37.

The external terminal electrodes 48 through 53 are arranged in an interleaved manner such that no two external electrodes which are electrically coupled to the same internal electrode 40 or 41 are adjacent one another.

In operation, the polarization of the first and second internal electrodes 40, 41 are preferably opposite to one another.

In order to increase the capacity of the multilayer capacitor 31, additional pairs of internal electrodes can be provided to define additional capacitor units. For example, the multilayer capacitor 31 can include two sets of capacitor units, each set being defined by a respective pair of first and second internal electrodes 40, 41 separated by a respective dielectric layer. The plurality of capacitor units are preferably connected in parallel by at least either appropriate ones of the first external terminal electrodes 48 through 53 or the second external terminal electrodes 60 through 65.

Each of the external terminal electrodes 48 through 53 and 60 through 65 is preferably formed so as to extend not only on the side surfaces 34 through 37 but also onto a part of each of the principal surfaces 32 and 33.

Figure 4:
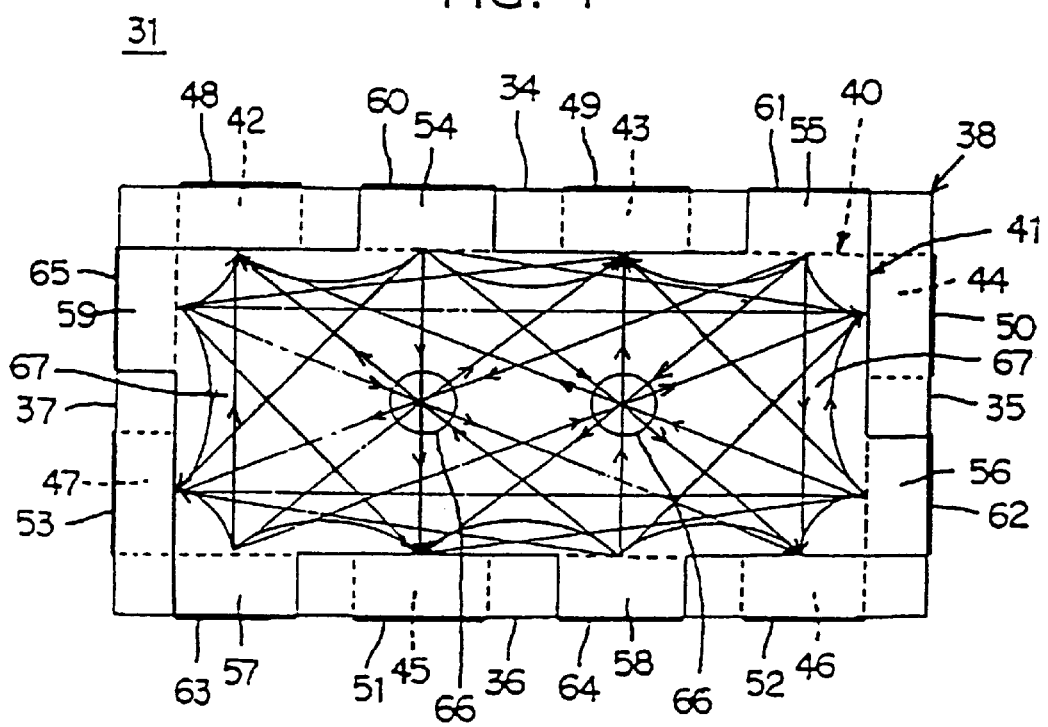
FIG. 4 is a plan view illustrating currents flowing in the multilayer capacitor 31.

FIG. 4 illustrates various currents flowing in the multilayer capacitor 31. In FIG. 4, the first internal electrode 40 is indicated by a broken line and the second internal electrode 41 is indicated by a solid line, the two electrodes being illustrated in an overlapping relationship.

As apparent from these typical paths and the directions of current flow indicated by the arrows in FIG. 4 (the direction of current flow indicates that direction of each of the noted current paths at a given point in time, the direction of the flow of current through these paths will alternate periodically), a current flows from each of the second external terminal electrodes 60 through 65 to each of the first external terminal electrodes 48 through 53. When such currents flow, induced magnetic flux is generated.

Figure 18:
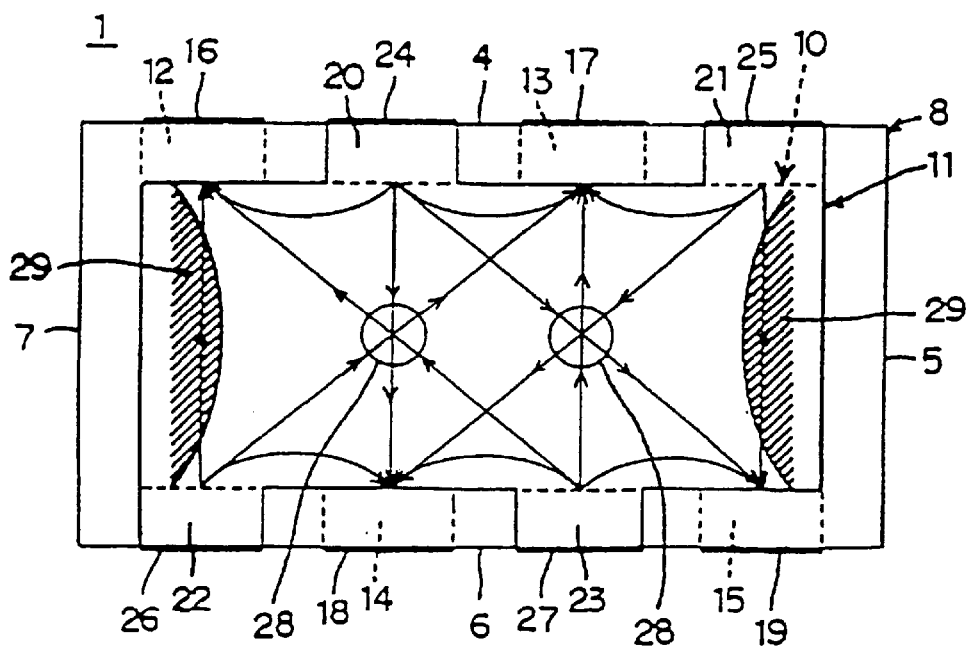
FIG. 18 is a plan view illustrating currents flowing in the multilayer capacitor 1 shown in FIG. 15.

As in the prior art, the various components of the induced flux at the central regions 66 indicated by the circles cancel one another out because currents flow in various directions. Similarly, the various components of the induced flux in the areas of the side surfaces 34 and 36 tend to cancel one another. In this connection, current flow in the area of side surfaces 34 and 36 is very similar to that of the prior art of FIG. 18.

However, the embodiment of FIGS. 1–4 produces a much more desirable result in the areas 67 adjacent the side surfaces 35, 37. Since the first external terminal electrodes 50 and 53 and the second external terminal electrodes 62 and 65 are provided at the side surfaces 34 and 36, there is no significant net current flow in the areas 67 and no significant generation of net magnetic flux.

As a result, the degree of net induced magnetic flux generated over the entire region of the multilayer capacitor 31 is significantly reduced, thereby allowing the ESL to be suppressed to a very low level.

Another advantage of this embodiment is that the current paths between each of the electrodes is reduced. Particularly, each of the first lead electrodes 42 through 47 (and the first external terminal electrodes 48 through 53) is located relatively close to its adjacent second lead electrode 54 through 59 (and the second external terminal electrode 60 through 64) compared to the prior art of FIG. 18. This reduces the lengths of the current paths and thereby reduces self-inductance components produced between them.

Second Embodiment

Figure 5:
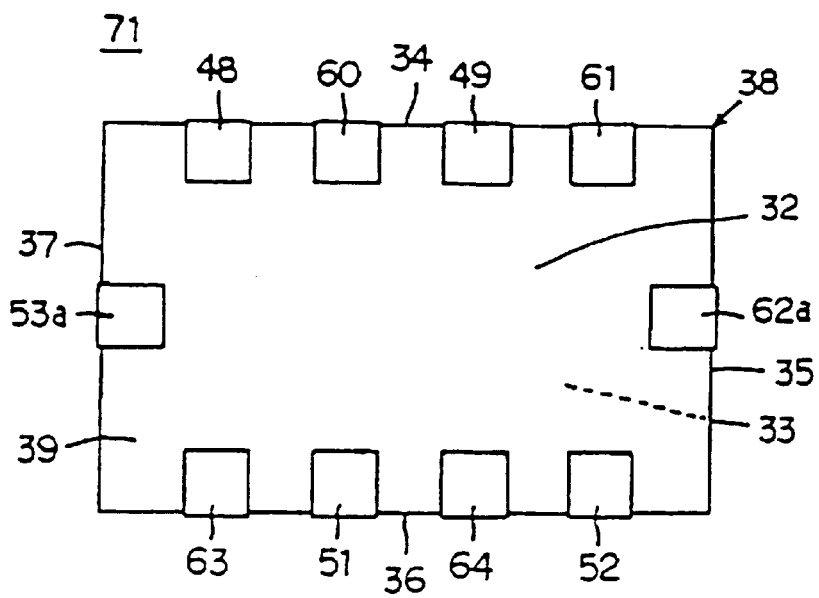
FIG. 5 is a plan view of a multilayer capacitor 71 according to a second embodiment of the invention showing the external appearance thereof.
Figure 6:
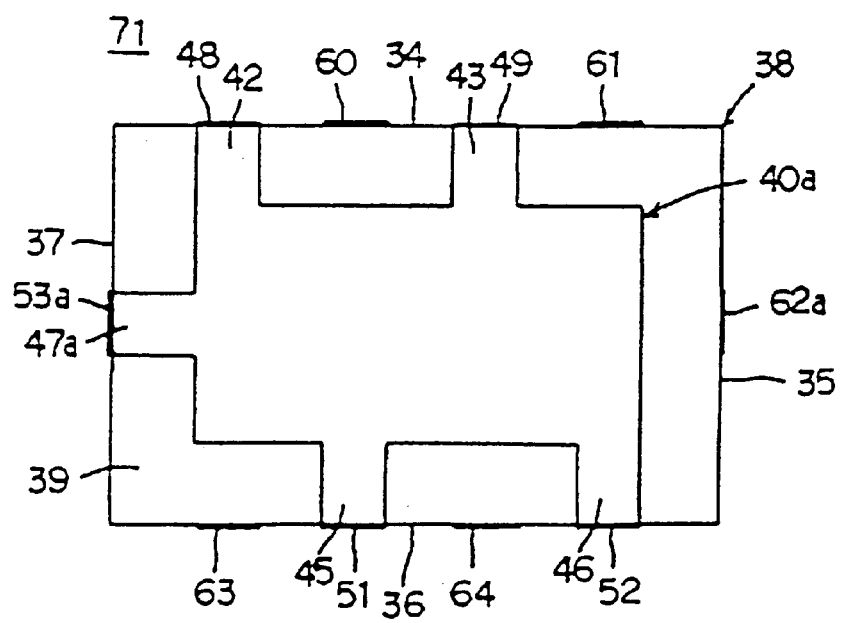
FIG. 6 is a plan view of a multilayer capacitor 71 shown in FIG. 5 showing an internal structure thereof in the form of a section along which a first internal electrode 40a extends.
Figure 7:
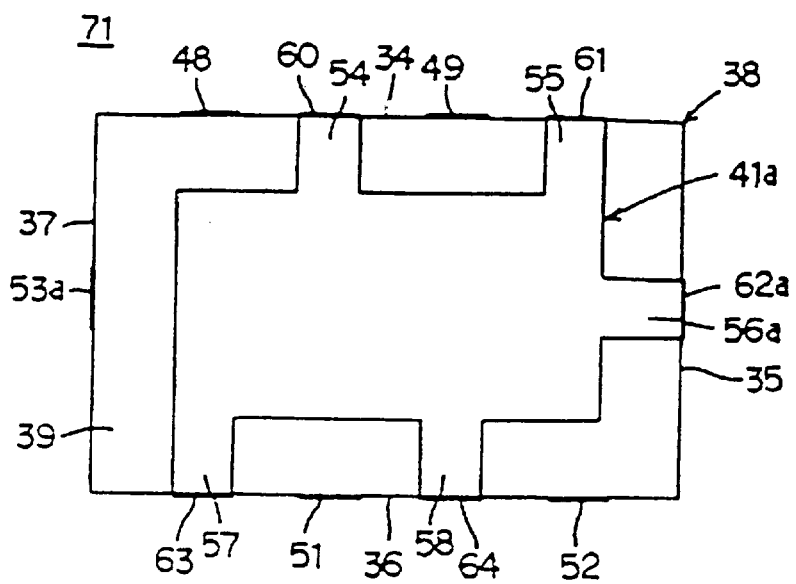
FIG. 7 is a plan view of the multilayer capacitor 71 shown in FIG. 5 showing an internal structure thereof in the form of a section along which a second internal electrode 41a extends.

FIGS. 5 through 7 show a multilayer capacitor 71 according to a second embodiment of the present invention. FIG. 5 is a plan view of the external appearance of the multilayer capacitor 71. FIG. 6 is a plan view showing one surface of an internal dielectric layer 39 of the multilayer capacitor 71 having a first internal electrode 40a located thereon. FIG. 7 is a plan view showing one surface of a different one of the internal dielectric layers 39 of the multilayer capacitor 71 having a second internal electrode 41a located thereon.

FIGS. 5 through 7 respectively correspond to FIGS. 1 through 3 of the first embodiment. In FIGS. 5 through 7, elements corresponding to elements shown in FIGS. 1 through 3 are indicated by like reference numbers and will not be described here to avoid duplication.

Referring to FIG. 6, the first internal electrode 40a is formed with five lead electrodes 42, 43, 45, 46 and 47a which extend to respective side surfaces 34, 36 and 37. The multilayer capacitor 71 is different from the multilayer capacitor 31 of the first embodiment in that the multilayer capacitor 71 has no lead electrode extending to side surface 35. Additionally, lead electrode 47a extends to the middle of the side surface 37, whereas lead electrode 47 extends to the upper half of side surface 37.

The five lead electrodes 42 through 47a are electrically coupled to five external terminal electrodes 48, 49, 51, 52 and 53a, respectively. The five external electrodes 48, 49, 51, 52 and 53a, are each located on one of the three side surfaces 34, 36 and 37. The multilayer capacitor 71 is different from the multilayer capacitor 31 of the first embodiment in that the multilayer capacitor 71 has no external terminal corresponding to the first external terminal electrode 50 and in that the external terminal electrode 53a is different in location from the external terminal electrode 53.

Referring to FIG. 7, a second internal electrode 41a has five lead electrodes 54, 55, 56a, 57 and 58 which extend to respective side surfaces 34 through 36. The multilayer capacitor 71 is different from the multilayer capacitor 31 of the first embodiment in that it has no lead electrode extending to the side surface 37 and in that the lead electrode 56a which extends to the side surface 35 extends to the middle of the side surface 35, rather than the bottom of the side surface 35 as is the case with lead electrode 56 of the first embodiment.

Each of the lead electrodes 54 through 58 is electrically coupled to a respective external terminal electrode 60, 61, 62a, 63 and 64. Each of these terminal electrodes are provided on a respective side surface 34 through 36. The multilayer capacitor 71 is different from the multilayer capacitor 31 of the first embodiment in that it has no external terminal corresponding to the external terminal electrode 65 and in that the external terminal electrode 62a is located in a different position than the external terminal electrode 62.

If desired, the capacity of multilayer capacitor 71 can be increased by providing a plurality of capacitive units, each defined by a respective set of internal electrodes 40a, 41a, separated by a respective dielectric layer 38. The plurality of capacitor units are then connected in parallel by appropriate ones of the external terminal electrodes 48 through 53a or 60 through 64.

In the second embodiment of the invention, each of the external terminal electrodes 48, 49, 51 and 52 coupled to the first internal electrode 40a is located adjacent at least one of the external terminal electrodes 60, 61, 63 and 64 coupled to internal electrode 41a. Further, only the second external terminal electrode 62a is located on the side surface 35, and only the first external terminal electrode 53a is located on the side surface 37. By providing the external terminal electrodes 62a and 53a on the side surfaces 35 and 37, respectively, it is possible to direct the flow of the currents on the internal electrodes 40a and 41a in various directions to achieve a level of cancellation of magnetic flux that is higher than that which is achievable in the conventional multilayer capacitor 1 shown in FIGS. 15 through 17. It is also possible to reduce the length of the path of these currents thereby further reducing the induced inductance components.

Third Embodiment

Figure 8:
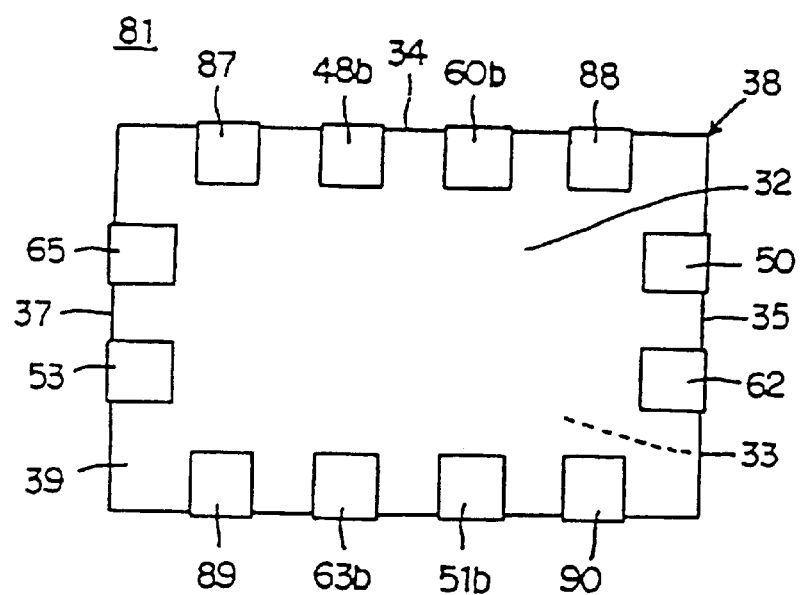
FIG. 8 is a plan view of a multilayer capacitor 81 according to a third embodiment of the invention showing the external appearance thereof.
Figure 9:
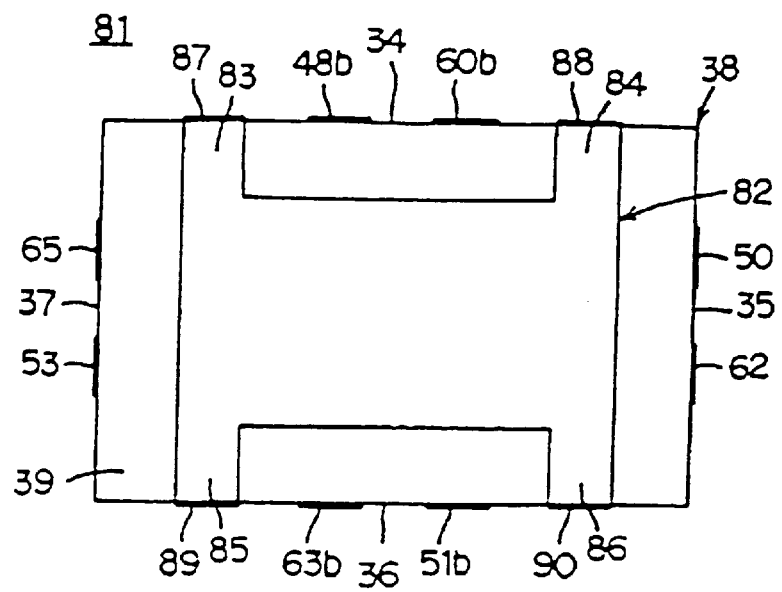
FIG. 9 is a plan view of the multilayer capacitor 81 shown in FIG. 8 showing an internal structure thereof in the form of a section along which a third internal electrode 82 extends.
Figure 10:
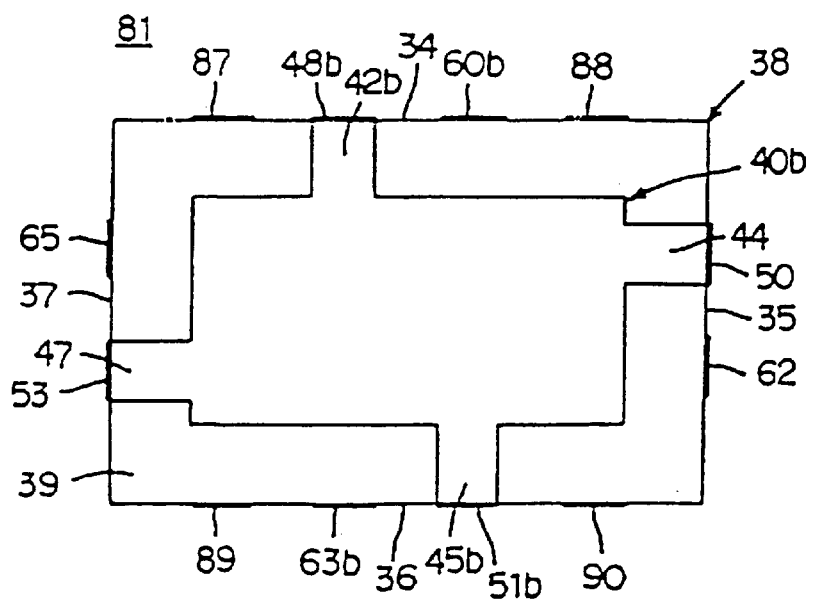
FIG. 10 is a plan view of the multilayer capacitor 81 shown in FIG. 8 showing an internal structure thereof in the form of a section along which a first internal electrode 40b extends.
Figure 11:
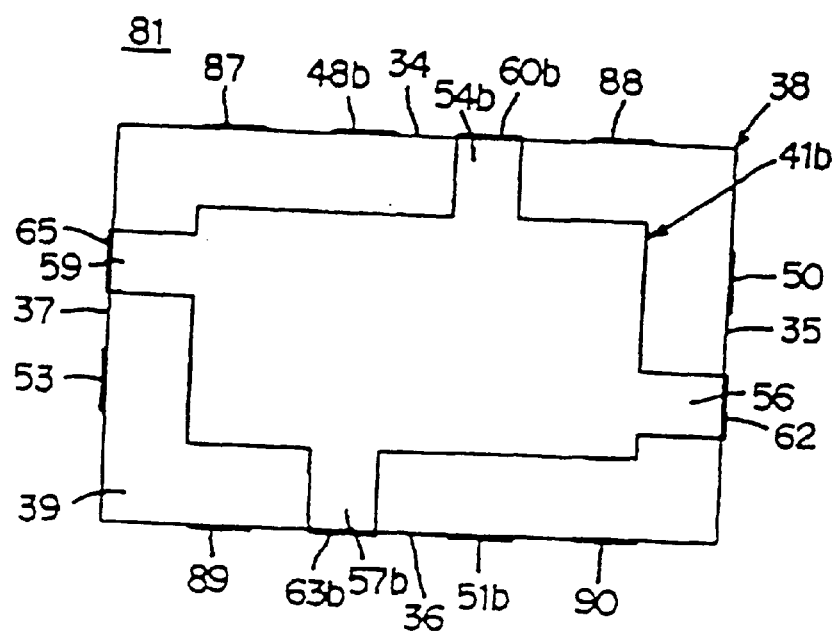
FIG. 11 is a plan view of the multilayer capacitor 81 shown in FIG. 8 showing an internal structure thereof in the form of a section along which a second internal electrode 41b extends.

FIGS. 8 through 11 show a multilayer capacitor 81 according to a third embodiment of the present invention. FIG. 8 is a plan view of the external appearance of the multilayer capacitor 81. FIG. 9 is a plan view of the surface of one of the internal dielectric layers 39 of the multilayer capacitor 81 having a first internal electrode 82 formed thereon. FIG. 10 is a plan view of the surface of one of the internal dielectric layers 39 of the multilayer capacitor 81 having a second internal electrode 40b formed thereon. FIG. 11 is a plan view of the surface of one of the internal dielectric layers 39 of the multilayer capacitor 81 having a third internal electrode 41b formed thereon.

In FIGS. 8 through 11, elements corresponding to elements shown in FIGS. 1 through 3 are indicated by like reference numbers and will not be described here to avoid duplication.

The multilayer capacitor 81 of the third embodiment of the invention includes a third internal electrode 82 facing at least either the first internal electrode 40b or second internal electrode 41b with a dielectric material layer 39 interposed therebetween. The third internal electrode 82 is formed with four lead electrodes 83, 84, 85 and 86, each of which extends to a respective side surface 34 and 36. More specifically, lead electrodes 83 and 84 extend to side surface 34, and lead electrodes 85 and 86 extend to side surface 36.

External terminal electrodes 87, 88, 89 and 90, which are electrically coupled to the lead electrodes 83 through 86, respectively, are provided on respective side surfaces 34 and 36. The multilayer capacitor.81 is different from the multilayer capacitor 31 of the first embodiment in that it includes the third external terminal electrodes 87 and 90 provided, respectively, in the positions where the first external terminal electrodes 48 and 52 are provided on the multilayer capacitor 31 of the first embodiment and includes the third external terminal electrodes 88 and 89 provided respectively in the positions where the second external terminal electrodes 61 and 63 are provided on the multilayer capacitor 31.

Referring to FIG. 10, a first internal electrode 40b has four first lead electrodes 42b, 44, 45b and 47 which extend to respective side surfaces 34 through 37. The first internal electrode 40b of the multilayer capacitor 81 is different from the multilayer capacitor 31 of the first embodiment in that it has only one lead electrode 42b which extends to side surface 34 and one lead electrode 45b which extends to side surface 36.

Four first external terminal electrodes 48b, 50, 51b and 53 are electrically coupled to the four first lead electrodes 42b through 47, respectively, and are provided on the four side surfaces 34 through 37, respectively. The multilayer capacitor 81 is different from the multilayer capacitor 31 of the first embodiment in that it includes the first external terminal electrodes 48b and 51b provided respectively in the positions where the second external terminal electrodes 60 and 64 are provided on the multilayer capacitor 31.

Referring to FIG. 11, a second internal electrode 41b has four second lead electrodes 54b, 56, 57b and 59 which extend to respective side surfaces 34 through 37. The second internal electrode of the multilayer capacitor 81 is different from the second internal electrode 41 of the multilayer capacitor 31 of the first embodiment in that only one lead electrode 54b extends to the side surface 34 and only one lead electrode 57b extends to side surface 36.

Four second external terminal electrodes 60b, 62, 63b and 65 are electrically coupled to the four first lead electrodes 54b through 59, respectively. The four second external terminal electrodes are provided on the four side surfaces 34 through 37, respectively. The multilayer capacitor 81 is different from the multilayer capacitor 31 of the first embodiment in that the second external terminal electrodes 60b and 63b provided, respectively, in the positions where the first external terminal electrodes 49 and 51 are provided on the multilayer capacitor 31.

By way of example, the multilayer capacitor 81 can be formed by locating the third internal electrode 82, the first internal electrode 40b and the second internal electrode 41b, one above the other with respective dielectric layers being located therebetween. Irrespective of the relative locations of the internal electrodes, the external terminal electrodes are arranged such that each of the third external terminal electrodes 87 through 90 is followed by one of the first external terminal electrodes 48b through 53 and then followed by one of the second external terminal electrodes 60b through 65. This alternating arrangement is repeated throughout the four side surfaces 34 through 37. The above-described order of stacking the internal electrodes 82, 40b and 41b may be changed arbitrarily.

In order to increase the capacity of the multilayer capacitor 81, a plurality of third internal electrodes 82, first internal electrodes 40b and second internal electrodes 41b may be provided to form a plurality of capacitor units. For example, a plurality of third internal electrodes 82 and a plurality of first internal electrodes 40b may be provided; a plurality of second internal electrodes 41b and a plurality of third internal electrodes 82 may be provided; or a plurality of third internal electrodes 82, a plurality of first internal electrodes 40b and a plurality of second internal electrodes 41b may be provided. The resultant capacitor units are connected in parallel by at least any of the third external terminal electrodes 87 through 90, the first external terminal electrodes 48b through 53 and the second external terminal electrodes 60b through 65.

Like the first embodiment, external terminal electrodes connected to different internal electrodes (that is, external terminal electrodes having different polarities) are located on each of the four side surfaces 34 through 37. More specifically, first external terminal electrode 48b, second external terminal electrode 60b and third external terminal electrodes 87 and 88 are located on the side surface 34; first external terminal electrode 50 and second external terminal electrode 62 are located on side surface 35; first external terminal electrode 51b, second external terminal electrode 63b and third external terminal electrodes 89 and 90 are located on side surface 36; and first external terminal electrode 53 and second external terminal electrode 65 are located on side surface 37.

Therefore, according to the third embodiment of the invention, since the flow of currents on the internal electrodes 40b and 41b can be directed in various directions to effectively cancel magnetic flux and to reduce the lengths of the current paths, the induced inductance components can be reduced.

Figure 15:
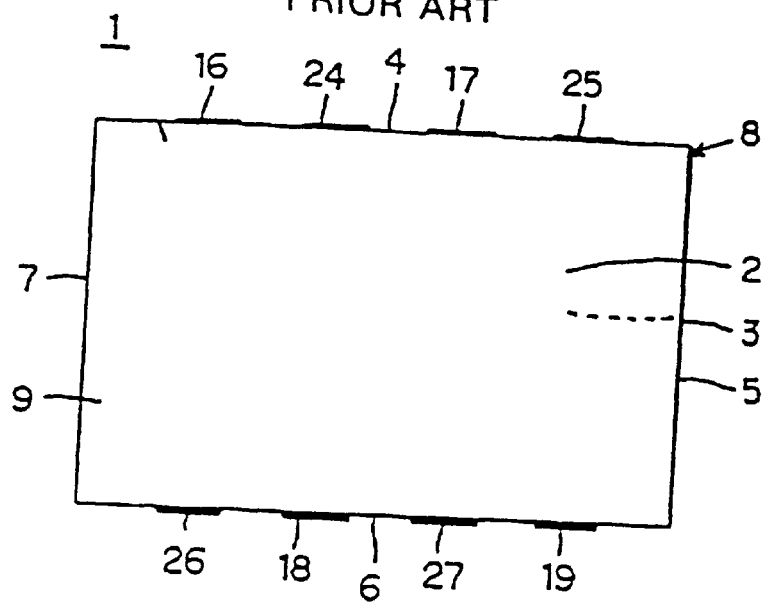
FIG. 15 is a plan view of a conventional multilayer capacitor 1 which is of interest to the present invention showing the external appearance thereof.
Figure 16:
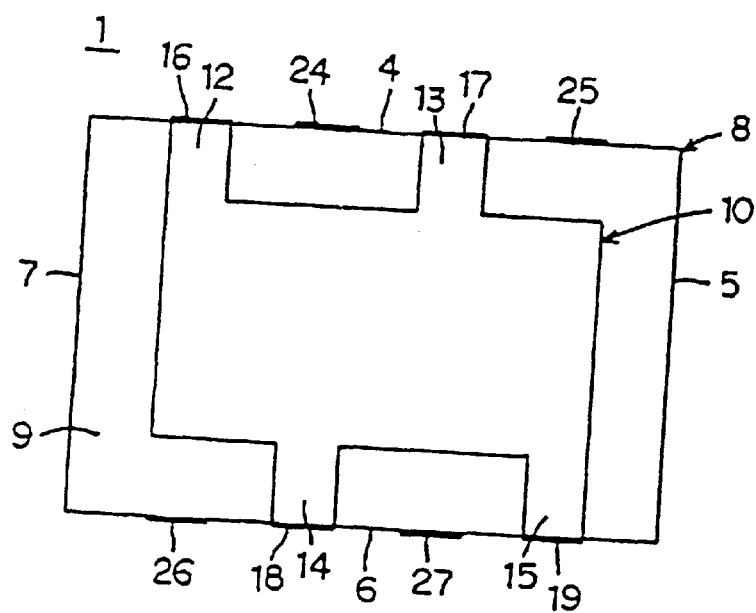
FIG. 16 is a plan view of the multilayer capacitor 1 shown in FIG. 15 showing an internal structure thereof in the form of a section along which a first internal electrode 10 extends.
Figure 17:
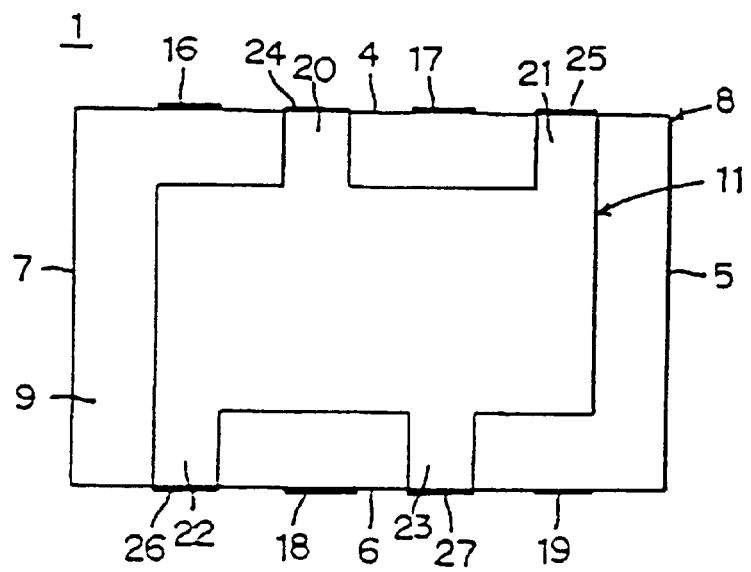
FIG. 17 is a plan view of the multilayer capacitor 1 shown in FIG. 15 showing an internal structure thereof in the form of a section along which a second internal electrode 11 extends.

Although the arrangement of the third embodiment is different from that in the first embodiment in that external terminal electrodes having different polarities are not necessarily adjacent to each other in all locations, the directions of the current flows on the internal electrodes 40b and 41b is more diverse than those in the conventional multilayer capacitor 1 shown in FIGS. 15 through 17 and the lengths of the current paths are shorter. This makes it possible to achieve a higher reduction of the induced inductance components.

As an alternative to the third embodiment, a multilayer capacitor may be provided in which only the first and second internal electrodes 40b and 41b are provided and the third internal electrode 82 is excluded. Further, the third internal electrode 82 may be formed with lead electrodes which extend to the side surfaces 35 and 37.

Fourth Embodiment

Figure 12:
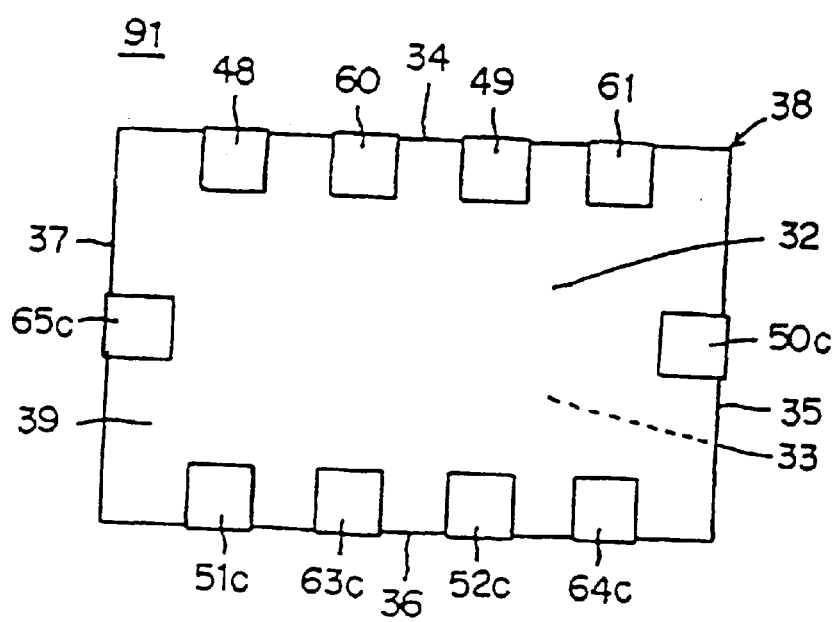
FIG. 12 is a plan view of a multilayer capacitor 91 according to a fourth embodiment of the invention showing the external appearance thereof.
Figure 13:
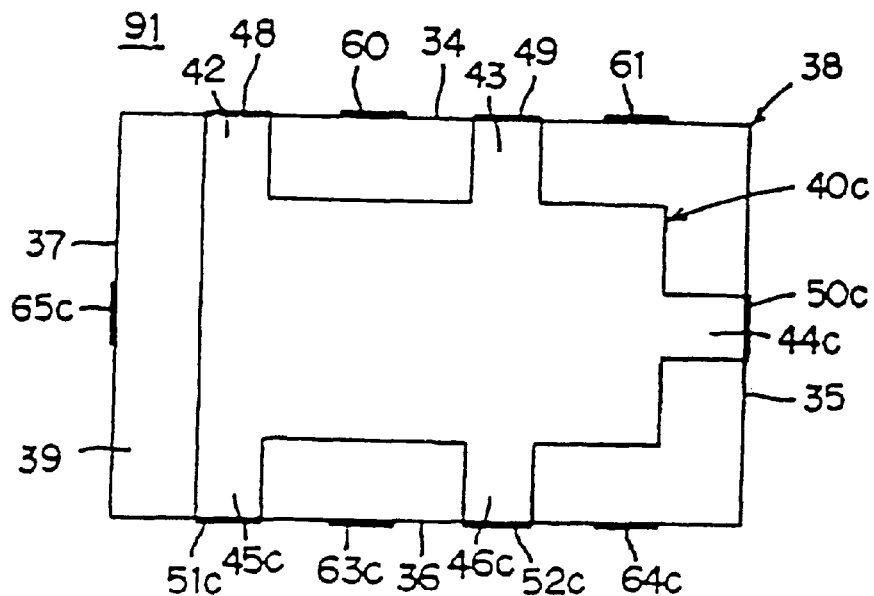
FIG. 13 is a plan view of the multilayer capacitor 91 shown in FIG. 12 showing an internal structure thereof in the form of a section along which a first internal electrode 40c extends.
Figure 14:
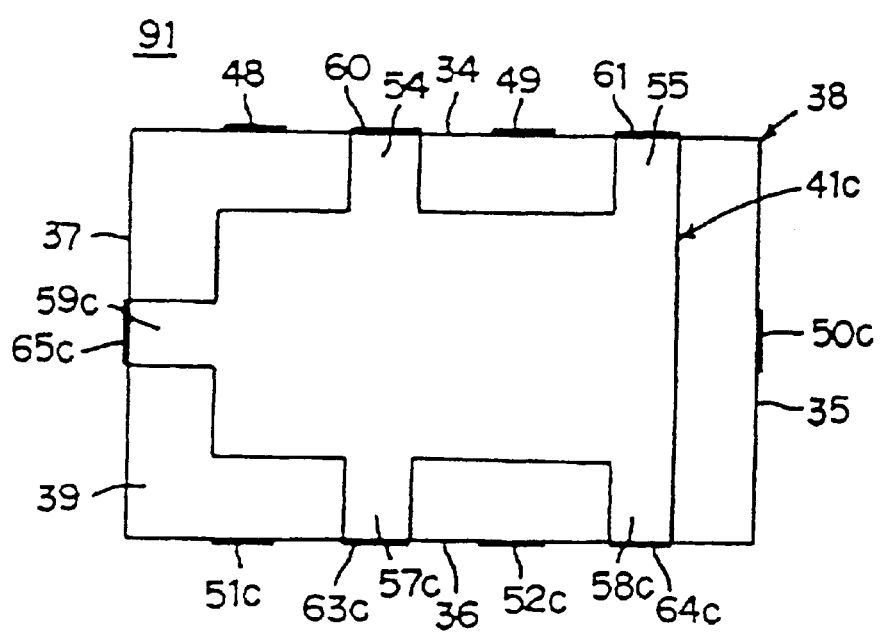
FIG. 14 is a plan view of the multilayer capacitor 91 shown in FIG. 12 showing an internal structure thereof in the form of a section along which a second internal electrode 41c extends.

FIGS. 12 through 14 show a multilayer capacitor 91 according to a fourth embodiment of the present invention. FIG. 12 is a plan view of the external appearance of the multilayer capacitor 91. FIG. 13 is a plan view of the surface of one of the dielectric layers of the multilayer capacitor 91 having a first internal electrode 40c formed thereon. FIG. 14 is a plan view of the surface of one of the dielectric layers of the multilayer capacitor 91 having a second internal electrode 41c formed thereon.

FIGS. 12 through 14 respectively correspond to FIGS. 1 through 3 of the first embodiment. In FIGS. 12 through 14, elements corresponding to elements shown in FIGS. 1 through 3 are indicated by like reference numbers and will not be described here to avoid duplication. the multilayer capacitor 91 of the fourth embodiment of the invention resembles the multilayer capacitor 71 of the second embodiment in its external appearance. A first internal electrode 40c has five first lead electrodes 42, 43, 44c, 45c and 46c which extend to respective side surfaces 34, 35 and 36. The multilayer capacitor 91 is different from the multilayer capacitor 31 of the first embodiment in that does not include a lead electrode corresponding to the lead electrode 47 which extends to the side surface 37 and in that the positions at which the lead electrodes 44c, 45c and 46c respectively extends to the side surfaces 35 and 36 are different from the positions that the lead electrodes 44 through 46 extend to those surfaces.

Five external terminal electrodes 48, 49, 50c, 51c and 52c are electrically coupled to the five lead electrodes 42 through 46c, respectively. These external electrodes are provided on the side surfaces 34 through 36. The multilayer capacitor 91 is different from the multilayer capacitor 31 of the first embodiment in that it does not include an external terminal electrode corresponding to the first external terminal electrode 53 and in that the positions of the external terminal electrodes 50c, 51c and 52c are different from the positions of the external terminal electrodes 50 through 52, respectively.

Referring to FIG. 14, a second internal electrode 41c has five lead electrodes 54, 55, 57c, 58c and 59c, each of which extends to a respective side surfaces 34, 36 and 37. The multilayer capacitor 91 is different from the multilayer capacitor 31 of the first embodiment in that it does not include a lead electrode corresponding to the lead electrode 59 which extends to the side surface 35 and in that the positions of the lead electrodes 57c, 58c and 59c are different from the positions of the lead electrodes 57 through 59, respectively.

The external terminal electrodes 60, 61, 63c, 64c and 65c which are electrically coupled to second lead electrodes 54 through 59c, respectively, are provided on the side surfaces 34, 36 and 37. The multilayer capacitor 91 is different from the multilayer capacitor 31 of the first embodiment in that it does not include an external terminal electrode corresponding to the second external terminal electrode 62 and in that the positions of the external terminal electrodes 63c, 64c and 65c are different from the positions of the external terminal electrodes 63 through 65, respectively.

In order to increase the capacity of multilayer capacitor 91, a plurality of first internal electrodes 40c and a plurality of second internal electrodes 41c can be provided. Pairs of internal electrodes 40c, 41c will face one another with a dielectric layer formed therebetween so as to form respective capacitor units. These capacitor units will be connected in parallel by at least either the first external terminal electrodes 48 through 52c or the second external terminal electrodes 60 through 65c.

Like the first embodiment described above, each of the first external terminal electrodes 48 through 52c of the fourth embodiment of the invention is arranged so as to alternate with respective ones of the second external terminal electrodes 60 through 65c throughout the four side surfaces 34 through 37. The fourth embodiment is different from the second embodiment in this regard.

Therefore, according to the fourth embodiment of the invention, since the flow of currents on the internal electrodes 40c and 41c can be directed in various directions, the various components of induced magnetic flux will be cancelled and the lengths of the current paths will be shortened relative to the prior art of FIGS. 15–17. The fourth embodiment will effectively reduce the induced inductance components to a degree which is similar to that of the first embodiment.

Fifth Embodiment

Figure 19:
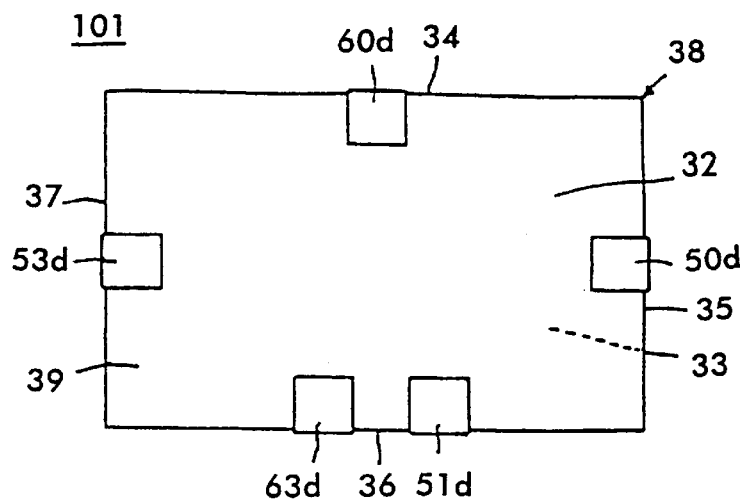
FIG. 19 is a plan view of a multilayer capacitor 101 according to a fifth embodiment of the present invention.
Figure 20:
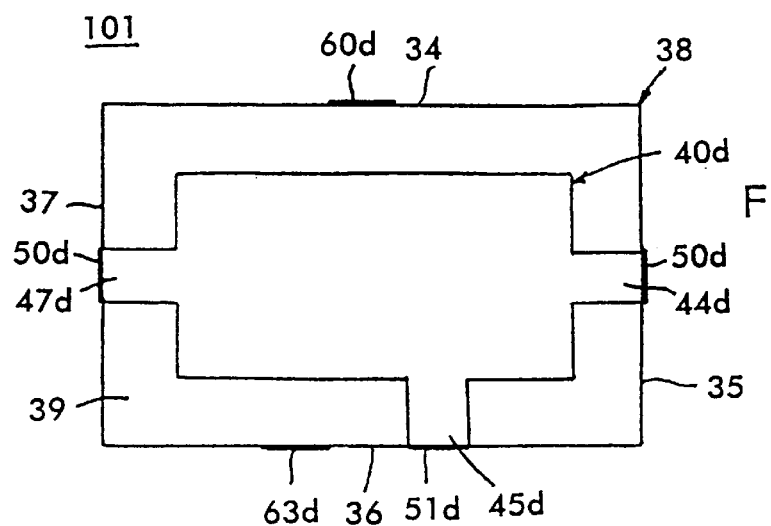
FIG. 20 is a plan view of the multilayer capacitor 101 shown in FIG. 19 showing an internal structure thereof in the form of a section along which a first internal electrode 40d extends.
Figure 21:
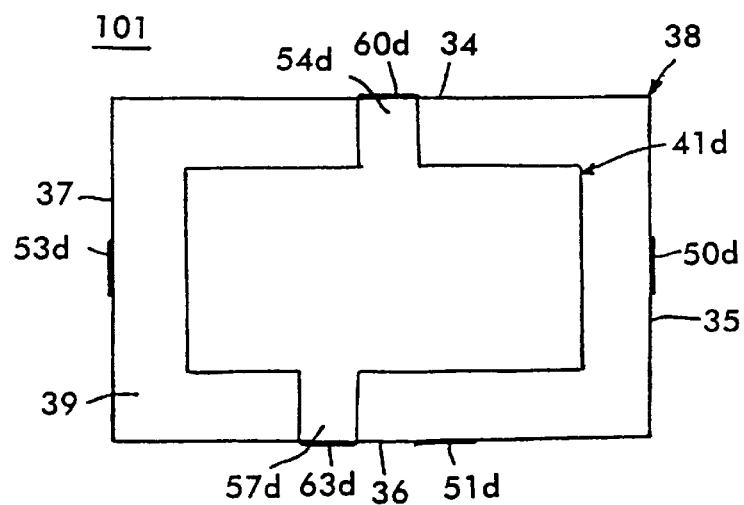
FIG. 21 is a plan view of the multilayer capacitor 101 shown in FIG. 10 showing an internal structure thereof in the form of a section along which a second internal electrode 41d extends.

FIGS. 19 through 21 show a multilayer capacitor 101 according to a fifth embodiment of the present invention. FIG. 19 is a plan view of the external appearance of the multilayer capacitor 101. FIG. 20 is a plan view of the surface of one of the dielectric layers of the multilayer capacitor 101 having a first internal electrode 40d formed thereon. FIG. 21 is a plan view of the surface of one of the dielectric layers of the multilayer capacitor 101 having a second internal electrode 41d formed thereon.

FIGS. 19 through 21 respectively correspond to FIGS. 1 through 3 of the first embodiment. In FIGS. 19 through 21, elements corresponding to elements shown in FIGS. 1 through 3 are indicated by like reference numbers and will not be described here to avoid duplication.

Referring to FIG. 20, a first internal electrode 40d has three first lead electrodes 44d, 45d and 47d which extend to respective side surfaces 35; 36 and 37. The multilayer capacitor 101 is different from the multilayer capacitor 31 of the first embodiment in that it does not include lead electrodes 42 and 43 which extends to the side surface 34, does not include a lead electrode 46 which extends to the side surface 36, and in that the positions at which the lead electrodes 44d, 45d, and 47d respectively extends to the side surfaces 35, 36 and 37 are different from the positions that the lead electrodes 44, 45 and 47 extend to those surfaces.

The three lead electrodes 44d, 45d and 47d are electrically coupled to three external terminal, electrodes 50d, 51d and 53d respectively. These external terminal electrodes are provided on the side surfaces 35 through 37. The multilayer capacitor 101 is different from the multilayer 31 of the first embodiment in that it does not include external terminal electrodes corresponding to the first external terminal electrodes 48, 49 and 52 in that the positions of the external terminal electrodes 50d, 51d and 53d are different from the positions of the external terminal electrodes 50, 51 and 53, respectively.

Referring to FIG. 21, a second internal electrode 41d has two lead electrodes 54d and 57d, each of which extends to respective side surfaces 34 and 36. The multilayer capacitor 101 is different from the multilayer capacitor 31 of the first embodiment in that it does not include lead electrodes corresponding to the lead electrodes 61, 62, 64 and 65 which extends to the side surfaces 34 through 37, respectively, and in that the positions of the lead electrodes 54d and 57d are different from the positions of the lead electrodes 54 and 57, respectively.

Two external terminal electrodes 60d and 63d are electrically coupled to the two lead electrodes 54d and 57d, respectively, and are provided on the side surfaces 34 and 36. The multilayer capacitor is different from the multilayer capacitor 31 of the first embodiment in that it does not include external terminal electrodes corresponding to the second external terminal electrodes 61, 62, 64 and 65, and in that the positions of the external terminal electrodes 60d and 63d are different from the positions of the external terminal electrodes 60 and 63, respectively.

In order to increase the capacity of multilayer capacitor 101, a plurality of first internal electrodes 40d and a plurality of second internal electrodes 41d can be provided. Therefore, according to the fifth embodiment of the invention, since the flow of the currents on the internal electrodes 40b and 41b can be directed in various directions to effectively cancel magnetic flux and to reduce the lengths of the current paths, the induced inductance components can be reduced.

Although the arrangement of the fifth embodiment is different from that in that first embodiment in that external terminal electrodes having different polarities are not necessarily adjacent to each other in all locations the directions of the current flows on the internal electrodes 40d and 41d is more diverse that those in the conventional multilayer capacitor 1 shown in FIGS. 15 and 17 and the lengths of the current paths are shorter. Therefore, this makes it possible to achieve a higher reduction of the induced inductance components.

Test Results

A sample of each of the multilayer capacitor 31 according to the first embodiment (embodiment 1), the multilayer capacitor 71 according to the second embodiment (embodiment 2), the multilayer capacitor 81 according to the third embodiment (embodiment 3), the multilayer capacitor 91 according to the fourth embodiment (embodiment 4) and the conventional multilayer capacitor 1 (comparative example) was fabricated and ESL of each of them was evaluated.

Each sample was formed with outer plan dimensions of 3.2 mm×2.5 mm. For samples having six layers of internal electrodes in total, i.e., those having two kinds of internal electrodes such as the multilayer capacitors 31, 71, 91 and 1 (embodiments 1, 2 and 4 and comparative example), the stacking of the two kinds of internal electrodes was repeated three times (i.e., three pairs of internal electrodes where used to form three capacitance units). For the sample having three kinds of internal electrodes, i.e., the multilayer capacitor 81 (embodiment 3), the stacking of the three kinds of internal electrodes was repeated twice.

ESL was obtained using the resonance method. The resonance method is a method wherein the impedance frequency characteristics of each of the sample multilayer capacitor is measured and ESL is obtained from a frequency $f_0$ at a minimum point (referred to as series resonance point between the capacity component $C_3$ and ESL of the capacitor) using the following equation.

$$ESL = 1/[(2\pi f_0)^2 \times C_6]$$

The measured value of ESL of each sample is shown in the Table 1 below.

TABLE 1

| | ESL Value (pH) |
|---|---|
| Embodiment 1 | 40 |
| Embodiment 2 | 72 |
| Embodiment 3 | 85 |
| Embodiment 4 | 51 |
| Comparative Example | 95 |

It is apparent from Table 1 that ESL was suppressed to a greater degree in each of the embodiments 1 through 4 than in the comparative example. The embodiment 1 was most advantageous in reducing ESL. The embodiment 4 was more advantageous than the embodiments 2 and 3 in reducing ESL, although it was less advantageous than the embodiment 1.

While the present invention has been described with reference to the illustrated embodiments, for example, it is possible to change positions and the number of the lead-out electrodes of the internal electrodes variously and to change the positions and number of the external terminal electrodes accordingly within the scope of the invention.

As described above, according to the preferred embodiments of the present invention, at least either a first or a second internal electrode is formed with at least three lead electrodes which extend respectively to at least three of the side surfaces of a capacitor main body, and external terminal electrodes which are electrically coupled to respective lead electrodes are provided on respective side surfaces. As a result, since the flow of currents on the internal electrodes can be directed in various directions to cancel magnetic flux and to reduce the lengths of the currents path effectively, ESL can be reduced.

With this structure, a high resonance frequency can be achieved and the frequency band of the capacitor can be increased. Accordingly, a multilayer capacitor according to the invention can accommodate electronic circuits at higher frequencies than was possible with the comparative example and can be advantageously used, for example, as a bypass capacitor or decoupling capacitor in a high frequency circuit. Further, while a decoupling capacitor used in an MPU (microprocessing unit) must also have the function of a quick power supply (a function of supplying power from an amount of electricity charged in the capacitor when there is a sudden need for power as in the case of power-up), a multilayer capacitor according to the invention can be used for such an application because it has low ESL.

In the embodiments of the present invention described below, the cancellation of magnetic fluxes as described above is further improved and the lengths of currents are further reduced to achieve more effective reduction of ESL.

It should be understood that the foregoing description is only illustrative of the invention various alternatives and modifications can be devised by those skilled in the art without departing from the invention. Accordingly, the present invention is intended to embrace all such alternatives, modifications and variances which fall within the scope of the appended claims.

What is claimed is:

1. A multi-layer capacitor device comprising:

a capacitor body including top and bottom surfaces and opposed side surfaces which have continuously flat surfaces and are disposed between the top and bottom surfaces and opposed end surfaces disposed between the top and bottom surfaces and the opposed side surfaces, the capacitor body including a plurality of first electrode plates and a plurality of second electrode plates, the first and second electrode plates being interleaved with each other in opposed and spaced apart relation;

a dielectric material located between each opposed set of said first and second electrode plates;

said first and second electrode plates each including a main electrode portion and a plurality of spaced apart lead structures extending therefrom, respective lead structures of said first electrodes plates being located adjacent respective lead structures of said second electrode plates in an interdigitated arrangement; and a plurality of electrical terminals located on each of the opposed side surfaces of the capacitor body, corresponding lead structures of said first electrode plates and corresponding lead structures of said second electrode plates being electrically connected together by respective ones of said electrical terminals to define a plurality of first polarity electrical terminals and a plurality of second polarity electrical terminals, respectively, located on said capacitor body; wherein each of the first polarity terminals is disposed opposite to another of the first polarity terminals across the capacitor body and each of the second polarity terminals is disposed opposite to another of the second polarity terminals across the capacitor body.

2. The multi-layer capacitor according to claim 1, wherein the capacitor body has a substantially rectangular shape.

3. The multi-layer capacitor according to claim 1, wherein the first polarity terminals and the second polarity terminals are provided only along the opposed side surfaces of the capacitor body.

4. The multi-layer capacitor according to claim 1, wherein at least one of the first polarity terminals is provided at one of the opposed end surfaces and one of the second polarity terminals is provided at another of the opposed end surfaces.

5. The multi-layer capacitor device according to claim 1, wherein the first polarity terminals are disposed opposite to each other across a width of the substantially rectangular capacitor body.

6. The multi-layer capacitor device according to claim 1, wherein the second polarity terminals are disposed opposite to each other across a width of the capacitor body.

7. The multi-layer capacitor device according to claim 1, wherein each of the first polarity terminals is disposed opposite to another of the first polarity terminals only across a width of the capacitor body.

8. The multi-layer capacitor device according to claim 1, wherein each of the second polarity terminals is disposed opposite to another of the second polarity terminals only across a width of the capacitor body.

9. The multi-layer capacitor device according to claim 1, wherein each of the first polarity terminals and the corresponding another of the first polarity terminals are located at a common position along a length of the capacitor body.

10. The multi-layer capacitor device according to claim 1, wherein each of the second polarity terminals and the corresponding another of the second polarity terminals are located at a common position along a length of the capacitor body.

11. The multi-layer capacitor device according to claim 1, wherein each of the first polarity terminals is adjacent to one of the second polarity terminals and each of the second polarity terminals is adjacent to one of the first polarity terminals along each of the opposed side surfaces of the capacitor body.

12. The multi-layer capacitor device according to claim 1, wherein the electrical terminals extend to portions of the top and bottom surfaces.

13. The multi-layer capacitor device according to claim 1, wherein none of the first polarity terminals is adjacent to others of the first polarity terminals on the opposed side surfaces of the capacitor body.

14. The multi-layer capacitor device according to claim 1, wherein none of the second polarity terminals is adjacent to others of the second polarity terminals on the opposed side surfaces of the capacitor body.

15. The multi-layer capacitor device according to claim 1, wherein each of the first and second electrode plates includes two of the lead structures extending to each of the pair of opposed side surfaces of the capacitor body.

16. The multi-layer capacitor device according to claim 1, wherein each of the pair of opposed side surfaces of the capacitor body includes at least two of the electrical terminals disposed thereon.

17. The multi-layer capacitor device according to claim 1, wherein each of the pair of opposed side surfaces of the capacitor body includes at least four of the electrical terminals disposed thereon.

18. A multi-layer capacitor according to claim 1, wherein the multi-layer capacitor is arranged to define a decoupling capacitor for a multiprocessing unit.

19. A high frequency circuit comprising at least one multi-layer capacitor according to claim 1.

20. The high frequency circuit according to claim 19, wherein the at least one multi-layer capacitor is arranged to define one of a bypass capacitor and a decoupling capacitor.

21. A wiring substrate comprising at least one multi-layer capacitor according to claim 1 mounted thereon.

22. A multi-layer capacitor device comprising:
a capacitor body including a pair of opposed side surfaces having continuously smooth surfaces and a pair of opposed end surfaces disposed between the pair of opposed side surfaces;
at least four electrical terminals disposed on each of the opposed side surfaces;
the capacitor body also including at least one first electrode plate having a substantially rectangular first main electrode portion with a plurality of first lead structures extending therefrom and at least one second electrode plate situated in opposed and spaced apart relation to said first electrode plate, said second electrode plate having a substantially rectangular second main electrode portion with a plurality of second lead structures extending therefrom, respective ones of said first lead structures being located adjacent respective ones of said second lead structures in an interdigitated arrangement and extending to respective ones of said electrical terminals; a dielectric material disposed between each opposing set of first and second electrode plates; wherein
each of the lead structures of the at least one first electrode plate being disposed opposite to another of the lead structures of the at least one first electrode plate across the capacitor body and each of the lead structures of the at least one second electrode plate being disposed opposite to another of the lead structures of the at least one second electrode plate across the capacitor body.

23. A multi-layer capacitor device according to claim 22, further comprising a plurality of first polarity polarity terminals and a plurality of second polarity terminals, wherein each of the first polarity terminals is disposed opposite to another of the first polarity terminals across a width of the capacitor body.

24. A multi-layer capacitor device according to claim 22, further comprising a plurality of first polarity polarity terminals and a plurality of second polarity terminals, wherein each of the second polarity terminals is disposed opposite to another of the second polarity terminals across a width of the capacitor body.

25. A multi-layer capacitor device according to claim 22, further comprising a plurality of first polarity polarity terminals and a plurality of second polarity terminals, wherein each of the first polarity terminals is disposed opposite to another of the first polarity terminals across a width of the capacitor body and each of the second polarity terminals is disposed opposite to another of the second polarity terminals across a width of the capacitor body.

26. The multi-layer capacitor according to claim 22, wherein the capacitor body has a substantially rectangular shape.

27. The multi-layer capacitor according to claim 22, further comprising a plurality of first polarity polarity terminals and a plurality of second polarity terminals, wherein the first polarity terminals and the second polarity terminals are provided only along the opposed side surfaces of the capacitor body.

28. The multi-layer capacitor according to claim 22, further comprising a plurality of first polarity polarity terminals and a plurality of second polarity terminals, wherein at least one of the first polarity terminals is provided at one of the opposed end surfaces and one of the second polarity terminals is provided at another of the opposed end surfaces.

29. The multi-layer capacitor device according to claim 22, further comprising a plurality of first polarity polarity terminals and a plurality of second polarity terminals, wherein each of the first polarity terminals is adjacent to one of the second polarity terminals and each of the second polarity terminals is adjacent to one of the first polarity terminals along each of the opposed side surfaces of the capacitor body.

30. The multi-layer capacitor device according to claim 22, further comprising a plurality of first polarity polarity terminals and a plurality of second polarity terminals, wherein none of the first polarity terminals is adjacent to others of the first polarity terminals on the opposed side surfaces of the capacitor body.

31. The multi-layer capacitor device according to claim 22, further comprising a plurality of first polarity polarity terminals and a plurality of second polarity terminals, wherein none of the second polarity terminals is adjacent to others of the second polarity terminals on the opposed side surfaces of the capacitor body.

32. The multi-layer capacitor device according to claim 22, wherein each of the first and second electrode plates includes two of the lead structures extending to each of the pair of opposed side surfaces of the capacitor body.

33. The multi-layer capacitor device according to claim 22, wherein each of the pair of opposed side surfaces of the capacitor body includes at least two of the electrical terminals disposed thereon.

34. The multi-layer capacitor device according to claim 22, wherein each of the pair of opposed side surfaces of the capacitor body includes at least four of the electrical terminals disposed thereon.

35. A multi-layer capacitor according to claim 22, wherein the multi-layer capacitor is arranged to define a decoupling capacitor for a multiprocessing unit.

36. A high frequency circuit comprising at least one multi-layer capacitor according to claim 22.

37. The high frequency circuit according to claim 36, wherein the at least one multi-layer capacitor is arranged to define one of a bypass capacitor and a decoupling capacitor.

38. A wiring substrate comprising at least one multi-layer capacitor according to claim 22 mounted thereon.

* * * * *